US012702025B2

(12) United States Patent
Pulugurtha et al.

(10) Patent No.: US 12,702,025 B2
(45) Date of Patent: Aug. 4, 2026

(54) SCALABLE ELECTRONICS MANUFACTURING WITH RIGID TILE PANEL EMBEDDING

(71) Applicants:Markondeyaraj Pulugurtha, Miami, FL (US); Satheesh Bojja Venkatakrishnan, Miami, FL (US); John Volakis, Miami, FL (US); Sajith Rathnayaka, Miami, FL (US)

(72) Inventors: Markondeyaraj Pulugurtha, Miami, FL (US); Satheesh Bojja Venkatakrishnan, Miami, FL (US); John Volakis, Miami, FL (US); Sajith Rathnayaka, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 19/072,087

(22) Filed: Mar. 6, 2025

(65) Prior Publication Data

US 2025/0285986 A1 Sep. 11, 2025

Related U.S. Application Data

(60) Provisional application No. 63/562,310, filed on Mar. 7, 2024.

(51) Int. Cl.
| | |
|---|---|
| *H10W 70/60* | (2026.01) |
| *H10W 74/10* | (2026.01) |
| *H10W 90/00* | (2026.01) |
| *H10D 1/20* | (2025.01) |
| *H10D 1/68* | (2025.01) |
| *H10W 90/10* | (2026.01) |
| *H10W 90/22* | (2026.01) |

(52) U.S. Cl.
CPC ........ *H10W 70/614* (2026.01); *H10W 74/114* (2026.01); *H10W 90/00* (2026.01); *H10D 1/20* (2025.01); *H10D 1/68* (2025.01); *H10W 70/60* (2026.01); *H10W 90/10* (2026.01); *H10W 90/22* (2026.01)

(58) Field of Classification Search
CPC . H01L 23/5389; H01L 23/3121; H01L 24/24; H01L 25/18; H01L 24/20; H01L 2224/215; H01L 2224/24137; H01L 2224/24146; H10D 1/68; H10D 1/20
See application file for complete search history.

(56) References Cited

U.S. PATENT DOCUMENTS

| | | | | |
|---|---|---|---|---|
| 2009/0149038 A1* | 6/2009 | Gabara | ................... | H01L 24/95 |
| | | | | 439/55 |
| 2015/0294896 A1* | 10/2015 | Hurwitz | ................ | H01L 25/071 |
| | | | | 438/15 |
| 2019/0035735 A1* | 1/2019 | Fitzsimmons | ...... | H01L 23/5383 |
| 2020/0044306 A1* | 2/2020 | Lee | ........................ | H01L 25/16 |

(Continued)

*Primary Examiner* — Jacob Y Choi
*Assistant Examiner* — Neil R Prasad
(74) *Attorney, Agent, or Firm* — SALIWANCHIK, LLOYD & EISENSCHENK

(57) ABSTRACT

Systems and methods are provided for electronic manufacturing, including use of a rigid tile-in-polymer film panel. Rigid tiles can be molded with a thin polymer composite to form the rigid tile-in-polymer film panel. The rigid panel can be made of silicon, glass, ceramic ribbon, or traditional glass fiber-reinforced laminates depending on the target product segment.

20 Claims, 12 Drawing Sheets

(56) References Cited

U.S. PATENT DOCUMENTS

| 2020/0105687 A1* | 4/2020 | Wang | H01L 23/66 |
| 2022/0045014 A1* | 2/2022 | Chen | H10W 42/20 |
| 2022/0157677 A1* | 5/2022 | Lin | H01L 24/19 |
| 2024/0186268 A1* | 6/2024 | Uzoh | H10W 42/121 |

* cited by examiner

Rigid cavity tile

Tough polymer composite matrix

Cavity to hold active and passive devices

Tile arrangement to minimize warpage and planarity

Polymer matrix selection for toughness, planarization and fine redistribution layer capability Various embodiments:

Form traces and bridges from terminations to the traces

Fan-out redistribution layers

Fan-out redistribution layers

Chipset in multi-tile and multi-scale fan-out packages

• Vias, cavities and plated copper doubleside Traces first

• Components inside the flex

• Planarization and patterning with photopolymer resin or laser

• Inkjet printed silver elastomer bridge interconnects

PCM heat-spreading and convectional cooling

Low-loss organic Laminates for AiP

Inorganic tile to hold the beamforming chips with high-density control circuits

SCALABLE ELECTRONICS MANUFACTURING WITH RIGID TILE PANEL EMBEDDING

CROSS-REFERENCE TO RELATED APPLICATION

This application claims the benefit of U.S. Provisional Application Ser. No. 63/562,310, filed Mar. 7, 2024, the disclosure of which is hereby incorporated by reference in its entirety, including all figures, tables, and drawings.

BACKGROUND

Advanced electronic manufacturing approaches and product architectures are critical to meet future diverse product needs in electronics, as well as to enabling leading-edge process tools and product design rules while also being compatible with wafer or panel fan-out manufacturing. Such embedded devices and systems will drive the future electronics industry that will take the trillion dollar semiconductor industry to multitrillion dollar markets for various product segments. The product segments range from computing, wireless communication, internet of things (IoT), and sensor devices. Current embedding approaches rely on organic laminates, silicon or glass interposers, or substrates.

BRIEF SUMMARY

Existing electronic manufacturing approaches are limiting for future electronics manufacturing for a variety of reasons. For example, laminates limit the wiring density and interconnect scaling to semiconductor geometries. Also, glass panels have handling challenges, high cost from via formation, and are relatively immature in high-volume manufacturing, which makes them prone to risks. Silicon interposers can be effective for high-performance computing because of their compatibility with standard wafer infrastructure, but they offer limited cost scalability.

Embodiments of the subject invention address the limitations of existing electronic manufacturing approaches by providing novel and advantageous systems and methods for electronic manufacturing including use of a rigid tile-in-polymer film panel. Rigid tiles can be molded with a thin polymer composite to form the rigid tile-in-polymer film panel. The polymer panel with rigid tiles can have several useful attributes, including being capable of and/or configured to be handled with standard panel manufacturing tools while the lithographic features can scale down to sub-micron dimensions. This is because the rigid panel can be made of silicon, glass, ceramic ribbon, or traditional glass fiber-reinforced laminates depending on the target product segment. For example, for wireless communications with high-density transceiver chips, the rigid tiles can be made of glass; for thin packages, the rigid tiles can be made of ceramic ribbons; and for high-performance three-dimensional (3D) interconnects with the best through-via pitches, the rigid tiles can be made of silicon interposers. The tiles in the panel can be designed of the reticle size so that they can be patterned with precise lithographic rules of submicron pitch.

In an embodiment, a heterogeneous multifunctional package architecture can comprise: a first substrate configured to support interconnect wiring and passive electronic components, the first substrate being multilayered, and the first substrate comprising a substrate chipset; a plurality of subsystem tiles disposed within the first substrate and comprising an active tile chipset; and a planar interconnect scheme between the active tile chipset and the substrate chipset. The first substrate can be double-sided such that an upper surface of the first substrate and a lower surface of the first substrate (opposite to the upper surface of the first substrate) are both configured to electrically connect to electrical components. The plurality of subsystem tiles can support at least one beamforming chip, at least one frequency conversion chip, at least one inductor, at least one capacitor, and/or at least one power management IC. The first substrate can comprise a beamforming communication device integrated therewith. The heterogeneous multifunctional package architecture can further comprise a second substrate electrically connected to the first substrate by at least one metal interconnect array. The heterogeneous multifunctional package architecture can further comprise a digital chip electrically connected to the first substrate, such that the heterogeneous multifunctional package architecture forms a computing device. The heterogeneous multifunctional package architecture can further comprise a vertical interconnect configured to connect to a second substrate that is configured to be an interposer circuit board. The heterogeneous multifunctional package architecture can further comprise the second substrate, which can be a digital chip interposer and/or a power device interposer.

In another embodiment, a subsystem tile for electronics can comprise: a rigid (i.e., unable to bend or be forced out of shape; not flexible) tile portion comprising at least one cavity configured to receive an electronic component; a polymer frame disposed around rigid tile portion; and at least one vertical interconnect disposed within the polymer frame. The rigid tile portion can be formed of, for example, an inorganic material (e.g., silicon, glass, ceramic ribbon, glass fiber-reinforced laminate(s)). The at least one cavity can be configured to receive an analog chip, a mixed signal chip, and/or a digital chip. The at least one cavity can be configured to receive an inductor, a capacitor, and/or a power management IC. The subsystem tile can comprise a stack of thin ceramic films and metal films disposed in the at least one cavity. The metal films can form extended electrodes on edges of the stack, and/or the stack can be metallized (e.g., with at least one metal ink). The stack can be fan-out interconnected to a plurality of electrical components (e.g., through the subsystem tile). The metal films can be, for example, nickel films.

In another embodiment, a beamforming communication device can comprise an antenna-in-package interconnected with a subsystem tile having features discussed in the previous paragraph. The antennas can be on the top as a vertical stack or even extended to the sides along the perimeter depending on the product design and the desired radiation characteristics. The subsystem tile can comprise an analog chip disposed in a first cavity of the at least one cavity, a mixed signal chip disposed in a second cavity of the at least one cavity, and a digital chip disposed in a third cavity of the at least one cavity.

In another embodiment, a computing device can comprise a digital chip interconnected with a subsystem tile having features discussed in the paragraph above the previous paragraph. The subsystem tile can comprise an inductor disposed in a first cavity of the at least one cavity, a capacitor disposed in a second cavity of the at least one cavity, and a power management integrated circuit disposed in a third cavity of the at least one cavity.

BRIEF DESCRIPTION OF DRAWINGS

FIG. 3A shows a top view of a rigid tile with cavities;

FIG. 3B shows a top view of inserted components; FIG. 3C shows a top view of planarization (i.e., filling gaps with one or more polymers); and FIG. 3D shows a top view of formation of vias and fan-out interconnects.

FIG. 4A shows a side view of a wet etching step to form cavities in a rigid tile, where photoresist can be used as etch masks for the wet etching. This can be done on a temporary carrier (not shown). FIG. 4B shows a side view of a step of embedding active devices and passive components. FIG. 4C shows a side view of a first step in forming fan-out redistribution layers. FIG. 4D shows a side view of a second step in forming fan-out redistribution layers. FIG. 4E shows a side view of a third step in forming fan-out redistribution layers. FIG. 4F shows a side view of forming interconnections and other components (e.g., memory stack and/or processor).

FIG. 7 shows low-loss organic laminates for an antenna-in-package (AiP) system, over an inorganic tile for holding the beamforming chips with high-density control circuits. Though FIG. 7 lists certain materials (e.g., organic laminate, inorganic tile), these are for exemplary purposes only and should not be construed as limiting).

DETAILED DESCRIPTION

Figure 1:
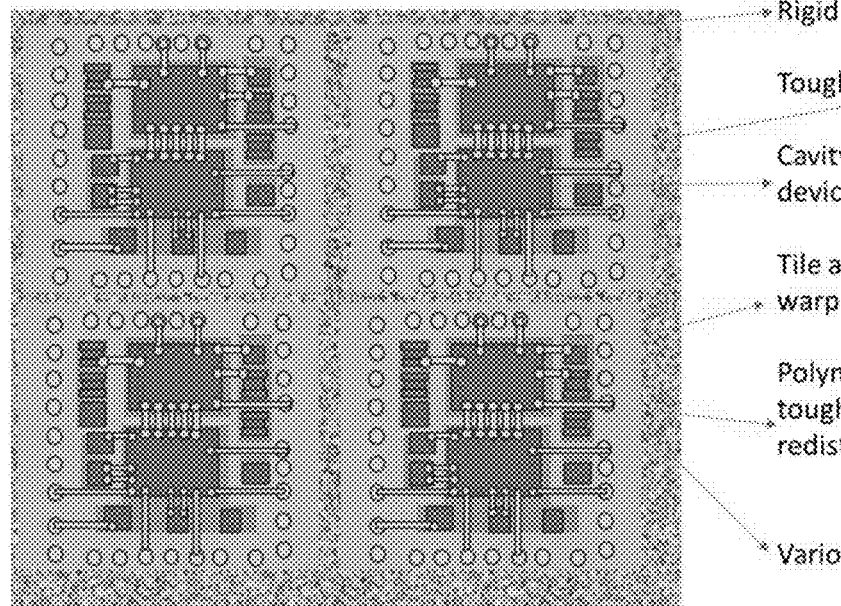
FIG. 1 shows a top view of a rigid flex panel with rigid tiles that houses pre-fabricated active and passive components, according to an embodiment of the subject invention.

Embodiments of the subject invention provide novel and advantageous systems and methods for electronic manufacturing including use of a rigid tile-in-polymer film panel. Rigid tiles can be molded with a thin polymer composite to form the rigid (i.e., not flexible) tile-in-polymer film panel. The polymer panel with rigid tiles can have several useful attributes, including being capable of and/or configured to be handled with standard panel manufacturing tools while the lithographic features can scale down to sub-micron dimensions. This is because the rigid panel can be made of silicon, glass, ceramic ribbon, or traditional glass fiber-reinforced laminates depending on the target product segment. For example, for wireless communications with high-density transceiver chips, the rigid tiles can be made of glass; for thin packages, the rigid tiles can be made of ceramic ribbons; and for high-performance three-dimensional (3D) interconnects with the best through-via pitches, the rigid tiles can be made of silicon interposers. The tiles in the panel can be designed of the reticle size so that they can be patterned with precise lithographic rules of submicron pitch.

The tile can be inorganic (e.g., silicon, glass, ceramic ribbon, or traditional glass fiber-reinforced laminates). The rigid tile-in-panel can have pre-formed cavities (and/or vias and/or slots) to house the semiconductor dies or other components in precise positions later. The embedded chips can be planarized with a polymer (shown in the figures in a green color). Thereafter, vias can be directly formed to interconnect and stitch the dies to each other and/or the rest of the system components. Because each tile can be sized to the reticle size, precise lithography can be achieved within. The cavities can house several classes of heterogeneous dies and components.

In an embodiment, the cavities can house transceiver chips and field programmable gate arrays (FPGAs) that are fan-out routed to the antenna array in a package, where the antenna is stacked on the top or extended to the edges along the perimeter. In another embodiment, the cavities can house power passive components such as capacitors and inductors that are interconnected to power management integrated circuits (ICs) (PMICs). In another embodiment, a controller, a processor, and/or radio frequency (RF) ICs can be routed to the other distributed sensor components. Several other embodiments can be used based on the required system functions.

In an embodiment, one or more capacitors (e.g., multi-layer ceramic capacitors (MLCCs)) can be pre-fabricated and embedded into the cavities. These can then be metallized with metal (e.g., copper or nickel), such as metal inks, and heat-treated to form the metallic interconnects. This eliminates the need for solder coat, barrier, and other coatings. In this way, a rigid tile of MLCCs as an embedded panel can be formed. Because the MLCCs are magnetic in nature, they can also be aligned with magnetic assembly techniques.

In many embodiments, the rigid tile-in-panel can have an optimized block layout to minimize warpage and planarity challenges. If the tiles are laid out as a matrix of rows and columns, it would be expected that they would suffer high warpage. In order to address this, the tiles can be arranged in a semi-random order to maximize long-range stiffness and thus minimize warpage.

In many embodiment, the rigid tile can have pre-deposited functional thin-films to incorporate one or more specific functions, such as phase shifters, decoupling capacitors, magnetic films, and others. This approach can also incorporate advanced polymer composites to mold the polymer.

FIG. 1 shows a top view of a rigid flex panel with rigid tiles that houses pre-fabricated active and passive components, according to an embodiment of the subject invention. Referring to FIG. 1, the panel can include one or more rigid tiles with cavities, a matrix (e.g., a polymer matrix or a polymer composite matrix), and active and passive devices disposed in the cavities. The tiles can be arranged to minimize warpage and either minimize or maximize planarity as desired. The matrix can be selected for toughness, planarization capability, and/or fine redistribution layer capability.

Figure 2:
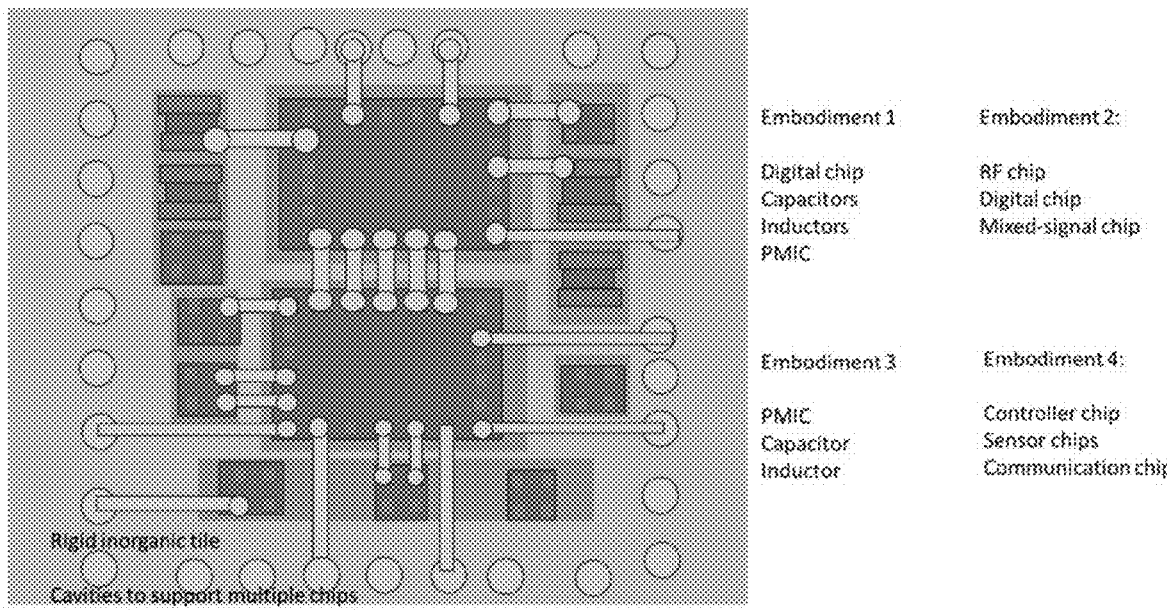
FIG. 2 shows a top view of fan-out interconnects of heterogenous chips for power, radio frequency (RF), internet of things (IoT), and/or digital product segments, according to an embodiment of the subject invention.
Figure 3A:
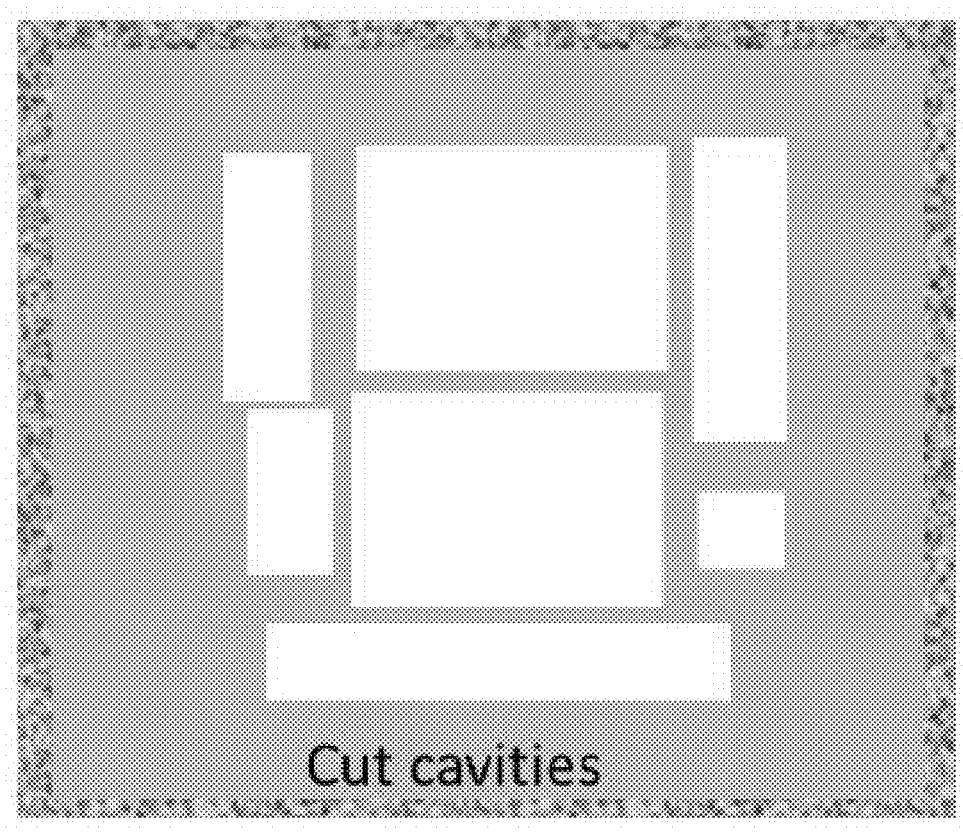
FIGS. 3A-3D show process steps for forming interconnect layers, according to an embodiment of the subject invention.
Figure 3B:
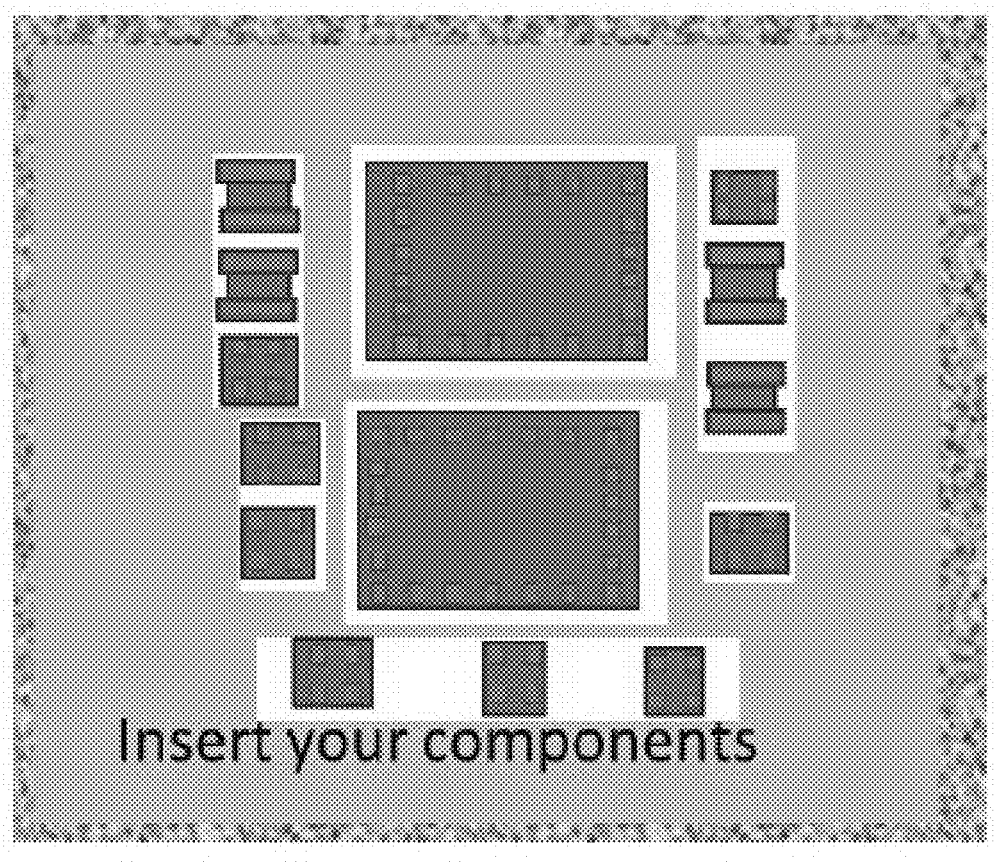
Figure 3C:
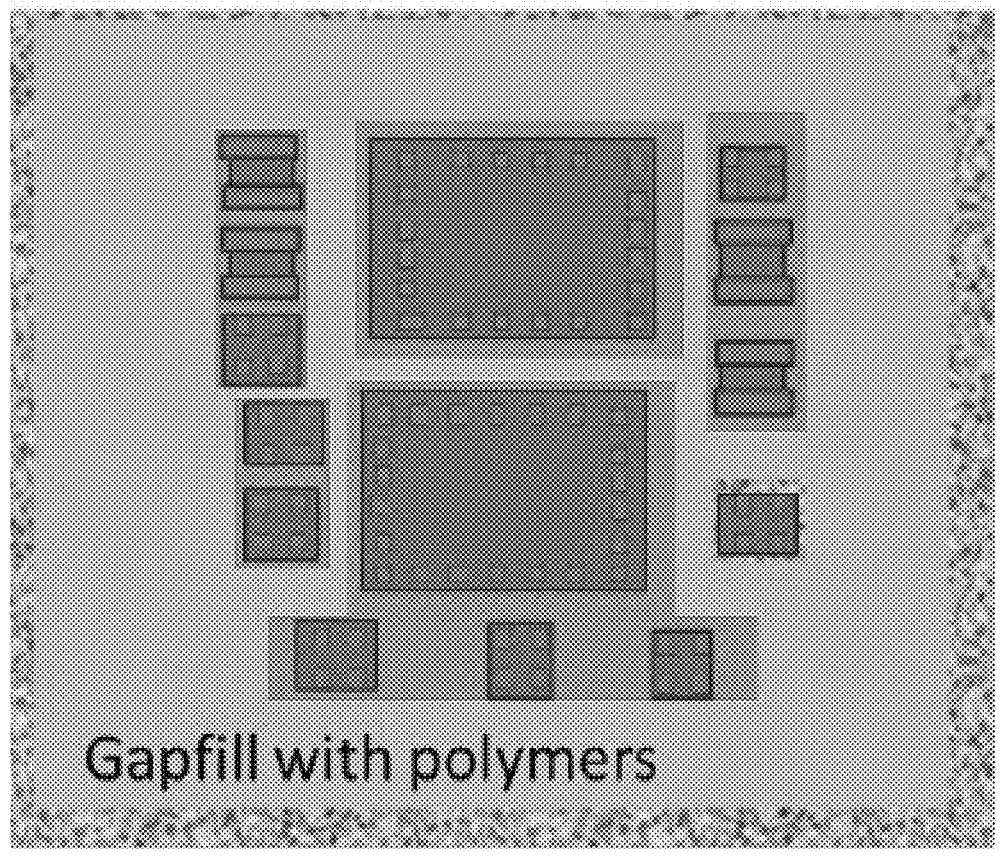
Figure 3D:
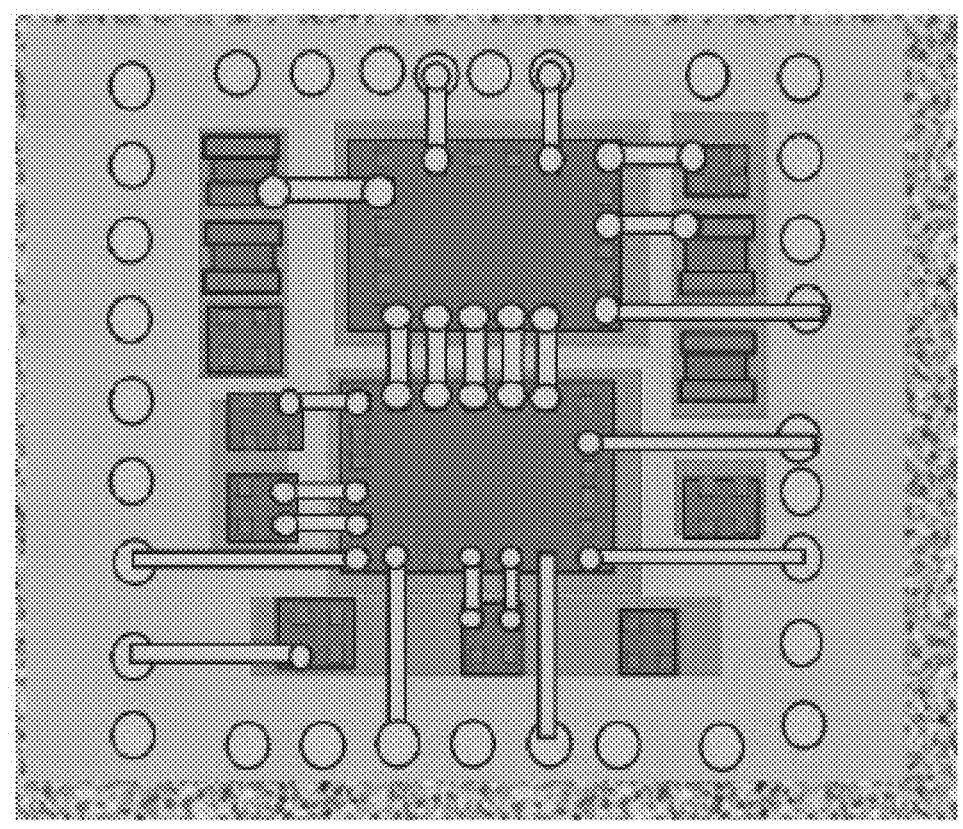

FIG. 2 shows a top view of fan-out interconnects of heterogenous chips for power, RF, internet of things (IoT), and/or digital product segments, according to an embodiment of the subject invention. Referring to FIG. 2, a rigid inorganic tile can include cavities to support multiple chips. Multiple embodiments are possible, including, for example the four embodiments listed on the right side of FIG. 2, where PMIC stands for power management integrated circuits.

FIGS. 3A-3D show process steps for forming interconnect layers, according to an embodiment of the subject invention. Referring to FIGS. 3A-3D, cavities (and/or vias and/or slots) can first be cut in a rigid tile, followed by inserting the electronic components (e.g., passive and/or active components) in the cavities. A planarization step can be performed to fill gaps with a polymer and/or polymer composite matrix. Then, traces can be formed and bridges can optionally be formed from terminations to the traces, thereby forming vias and fan-out interconnects.

Figure 4A:
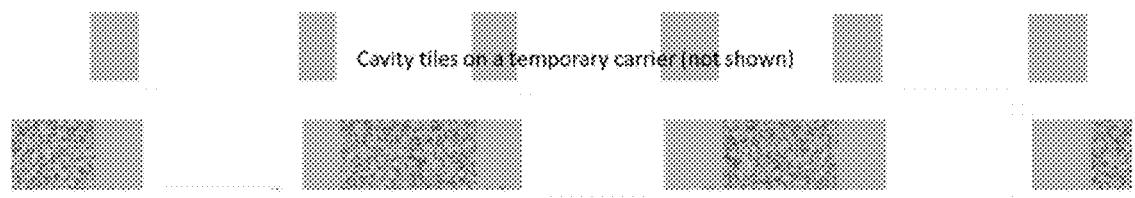
FIGS. 4A-4F show a manufacturing process flow, according to an embodiment of the subject invention.
Figure 4B:
Figure 4C:
Figure 4D:
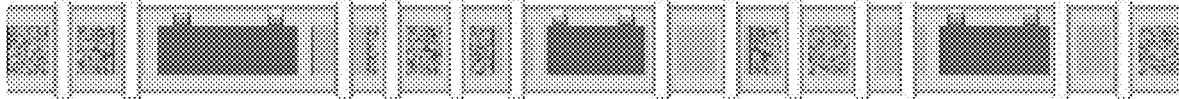
Figure 4E:
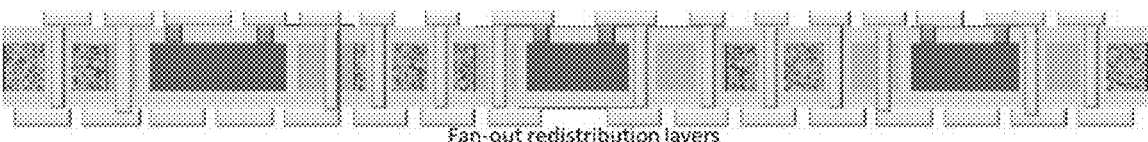
Figure 4F:
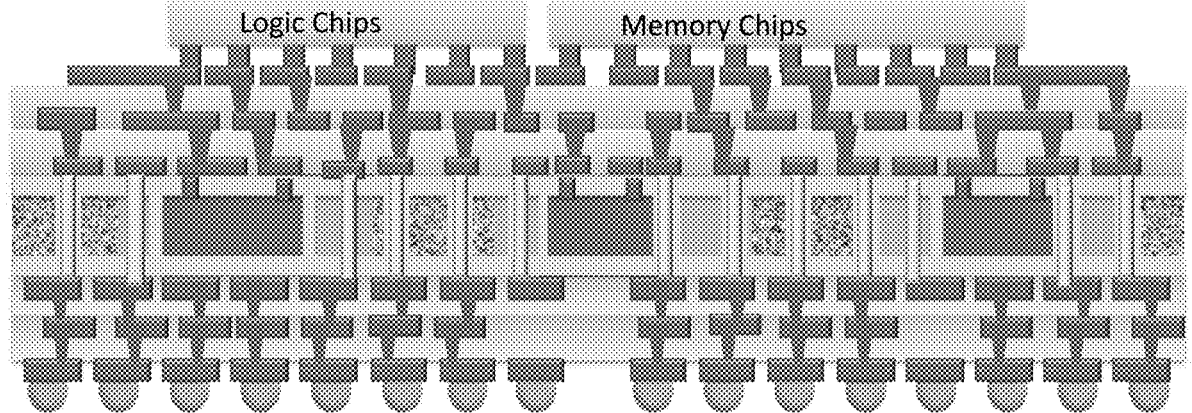

FIGS. 4A-4F show sides views of a manufacturing process flow, according to an embodiment of the subject invention. Referring to FIGS. 4A-4F, cavities (and/or vias and/or slots) can be formed in a rigid tile. A wet etching step can be used to form the cavities, and photoresist can be used as etch masks for the wet etching (FIG. 4A). This can optionally be done on a temporary carrier (not shown). A film (e.g., a polymer film or a polymer composite film) can be molded into the cavities, and electronic components (e.g., passive and/or active devices) can be embedded in the cavities (FIG. 4B). This can include using: fine-pitch through-vias; blind vias; vias of a size in a predetermined range (e.g., a range of from 20 micrometers ($\mu$m) to 30 $\mu$m); via-pad alignment in a predetermined range (e.g., a range of from 3 $\mu$m to 5 $\mu$m); and/or one or more lasers (e.g., carbon dioxide ($CO_2$) or ultraviolet (UV) lasers, having a power in a range of from 1 Watt (W) to 30 W with different power setting(s) and/or different scanning patterns). Next, fan-out redistribution layers can be formed (e.g., traces and optionally bridges from terminations to the traces). This can include using: seed layers (FIG. 4C) (e.g., metal seed layers, such as titanium (Ti) and/or copper (Cu) seed layers); a large-area (e.g., in a range of from 8 inches to 30 inches) sputtering system; conformal sputtering in high aspect-ratio vias with RF and/or direct current (DC) power source(s) (FIG. 4D); large-area projection lithography; small lines and spaces (e.g., of a size of 2 $\mu$m or below) compatible with most photoresists; semi-additive patterning; dry film lithography and/or liquid photoresist lithography; photopatterning; and/ or large-area metal (e.g., Cu) plating (FIG. 4E). Other components (e.g., interconnections, memory stack, and/or processor) can be formed (FIG. 4F). This can include: fine-pitch interconnections (e.g., interconnections with a pitch in a range of from 10 $\mu$m to 30 $\mu$m); and/or excellent alignment precision (e.g., precision of 2 $\mu$m or less, 1 $\mu$m or less, or in a range of from 1 $\mu$m to 2 $\mu$m).

In the manufacturing process, vias, cavities, and/or other slots can be formed in the rigid tiles, which can be made of, for example, glass, silicon, Cu, aluminum (Al), or other components. Tiles with vias and cavities can be formed by, for example, laser or wet etching. Laser formation is adaptable to any substate while wet etching relies on specific glass substrates. This can then be followed by molding in a film (e.g., a polymer film or a polymer composite film). ICs can be embedded inside cavities and planarized with a polymer to form the redistribution layers. The process can be adaptable to several module functions and designs.

Embodiments of the subject invention provide rigid inorganic tiles with cavities that hold analog, mixed signal, and digital chips. A polymer frame can be disposed around the tile and can hold certain vertical interconnects and/or components, which can be interconnected to an antenna-in-package (e.g., to form a multibeam forming communication module). Embodiments also provide rigid inorganic tiles with cavities that hold PMICs, capacitors, and/or inductors. A polymer frame can be disposed around the tile and can hold certain vertical interconnects and components, which can be interconnected to a digital chip (e.g., to form a computing module). Embodiments also provide a rigid inorganic tile with cavities that houses a stack of thin ceramic films and metal (e.g., nickel) film stacks to alternately form extended electrodes on each edge. These can be insert in the cavities in the tile, metallized (e.g., with metal inks), and fan-out interconnected to other system components through the tile.

Embodiments of the subject invention provide a manufacturing process including forming rigid inorganic tiles with cavities, molding with a polymer or polymer composite, and forming double-side redistribution layers to interconnect and stitch IC termination pads. The polymer composite can comprise, for example, polyimide, epoxy, polybenzoxazole, or a combination thereof. The polymer composite can comprise (e.g., in addition to the polymer) silica, alumina, other fillers, or a combination thereof. The tiles can comprise, for example, glass, ceramic ribbon, and/or epoxy laminate with glass fiber cloth.

Embodiments of the subject invention provide a novel electronics manufacturing approach where rigid tiles with cavities are embedded with a polymer-based matrix. The rigid tiles can house a variety of embedded chips to form power, 5G, 6G, and/or IoT sensor functions. The platform, with its variants, can be optimized for different market segments. The manufacturing is scalable to finer dimensions and high volume, thereby improving performance at a lower cost per unit.

Panel fan-out (PFO) packaging is important for the future manufacturing of electronics because of its several advantages such as utilization of low-loss materials, direct formation of interconnects with chip terminations for low losses, and double-side assembly of other system components, among others. High-density PFO gives precise and dense interconnects between the power, controller, sensor, and communication chiplets. Embodiments of the subject invention provide a hybrid technology integration that benefits from both high-density PFO packaging and additive manufacturing. Both photopatterning and additive manufacturing benefits from its 3D and adaptive patterning techniques for fabricating complex structures. In this approach, a vision system software can look at the device terminations and adjust the printed traces. Embodiments of the subject invention, thus, build on the foundational capability in additive manufacturing to provide a new approach for package-integrated thermal management that will increase the achievable functional density by potentially multiple orders of magnitude over related art systems and methods for low-cost packages.

Fan-out packaging technology in panel substrates provides a unique low-cost manufacturing path to realize such architectures. The resulting shorter interconnects lead to lower insertion losses and easier integration of other system components. Such embedded-chip interconnect technologies can be used for packaging in the case of both high- and low-density interconnects (see also, Watanabe et al., A review of 5G front-end systems package integration, IEEE Transactions on Components, Packaging and Manufacturing Technology, vol. 11, no. 1, pp. 118-133, 2020; and Al-Duhni et al., Nanopackaging for FutureG Solutions, IEEE Nanotechnology Magazine, vol. 18, no. 2, pp. 10-20, 2024; both of which are hereby incorporated by reference herein in their entireties. Embodiments of the subject invention utilize thin interposer designs with PFO packaging to provide low interconnect parasitic losses and embedded passives. Chip-in-tile subsystems can be used with at least the following three classes of electronic modules.

Power tile integration: In this case, switches and passive elements can be integrated in the tile. This tile can then be integrated into a substrate (e.g., a laminate substrate).

RF tile integration: Design of an end-to-end package including individual building blocks such as the launchers, filters, and wideband transitions is a key step towards 5G package integration. As more bands are added, more integration of filters and diplexers are needed at every stage. This integration enables the realization of the entire RF communication chain within the package, and enhances the overall performance and efficiency. An important feature is integration of active devices with passive components, such as filters, power-dividing networks, matching networks, meta-surfaces, and electromagnetic interference (EMI) shields along with antennas in the same substrate. Being embedded with double-side metallization provides direct access to the backside surface for two-phase liquid cooling.

Sensor power, controller, and communication tile: In this case, a controller chip, supporting passives, and associated chiplets can be integrated into one tile.

In some embodiments, a tile can be in laminate or flex. These power and communication systems can be integrated into other tiles (e.g., 3D integrated). An example can include embedded tiles inside laminate cavities, embedding, and/or interconnects. The same approach can also be applied to tiles inside flex.

With respect to embedded chip-in-tile and tile-in-flex/laminate fan-out packaging, similar processes with different design rules and process modifications can be utilized for both chip-in-tile and tile-in-flex embedding approaches. Embedding can be carried out with two key strategies: i) cavity-embedding, gap-fill and planarization, and patterned metal redistribution layers; and ii) pre-patterned wiring, cavity embedding, and printed off-chip bridge connections.

The second strategy has certain advantages, such as process simplicity and minimal additive manufacturing for the off-chip interconnects. The off-chip interconnects can be adaptively patterned to accommodate die-shifts. The second strategy can utilized photopatterning with some scalability advantages. Redistribution layers can be fully formed with semi-additive patterning.

With respect to cavity-embedding, photopatterning, and patterned metal redistribution layers, in related art fan-out packaging, planarization and gap-fill can be achieved with lamination molding of epoxy-based dry-films. The resulting embedded-chip laminate is fan-out interconnected with laser vias that land on the chip terminations. Subsequent metallization is achieved with semi-additive patterning. Embodiments of the subject invention can provide an alternative approach, where planarization and vias can also be formed with photopatterning or printing techniques such as screen-printing or inkjet printing. This approach has several advantages, such as scalability of vias to finer geometries, simultaneous exposure of backside for direct copper metallization with double-side plating. The backside metallization provides the lowest thermal resistance to the heat-spreader.

Power amplifier chips can be embedded in tiles for their high efficiency and power handling. The key module design includes signal in and signal out, along with power supply. Power supply can be achieved with a direct current (DC) input and a range of filter capacitors. The layouts can be completed and taped-out for fabrication using the photodefinable dielectrices for PFO packaging. The layout was developed using panel fan-out packaging for compactness and efficient heat dissipation. A critical design feature is the cavity, which allows for proper alignment and seating of the chip, aiding both mechanical stability and thermal management. Power supply connections can be stabilized with decoupling capacitors to minimize noise, and the ground plane can be optimized for thermal and electrical performance.

Figure 5:
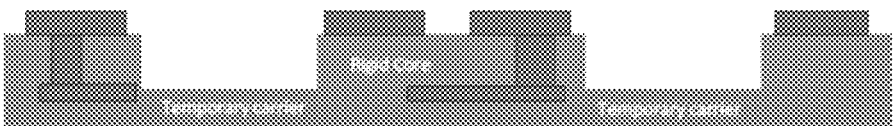
FIG. 5 shows a process flow for panel fan-out (PFO) embedding with prepatterned substrates and printed bridge connections, according to an embodiment of the subject invention.
Figure 5:
Figure 5:
Figure 5:
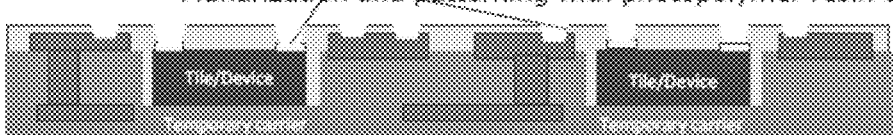
Figure 5:
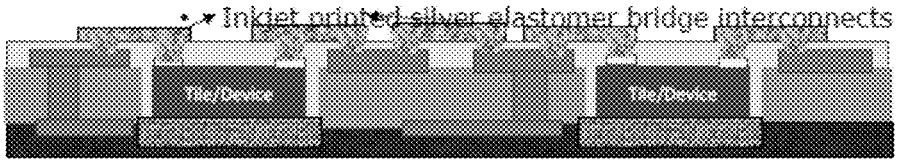

The process flow for fabrication of chip-in-tile or tile-in-laminate interconnects is illustrated with simple devices as representative components (see also FIG. 5). To produce chip-in-laminate samples, cavities with the dimensions of chips that need to be embedded were cut in the substrate using a laser. The resistors with die pads facing up were assembled into the cavity using an adhesive strip. A resin fill was applied through a nozzle syringe, or in some cases with screen-printed dielectric, followed by curing at room temperature for 4 hours; this creates bridges on which interconnections can be formed. Using a screen-printer, bridge connections can be made using silver-paste or ink composites and cured (e.g., at 120° C. for 10 minutes). After the fabrication of the substrates, the assembly was encapsulated, followed by curing of the polymer.

Figure 6:
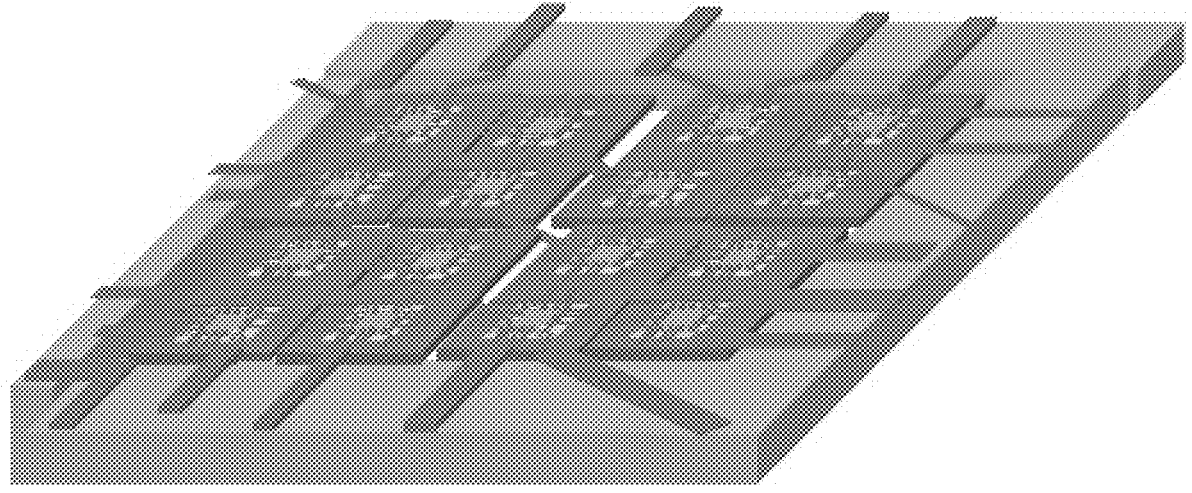
FIG. 6 shows a perspective view of multiple subsystem tiles forming an integrated system, according to an embodiment of the subject invention.
Figure 7:
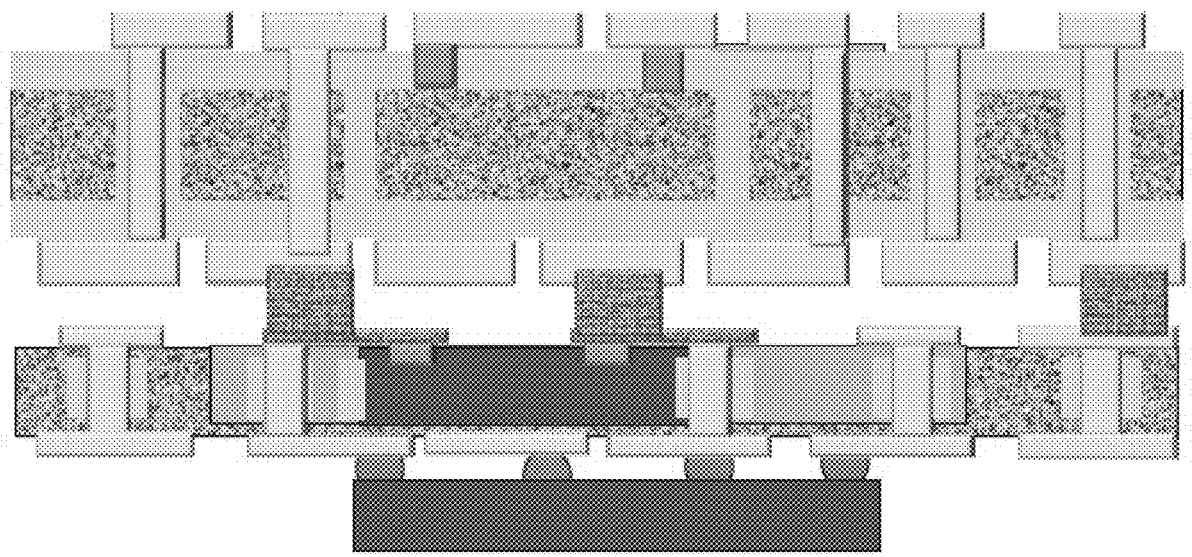
FIG. 7 shows a side view of a subsystem tile, according to an embodiment of the subject invention.

Embodiments of the subject invention provide new architectures and manufacturing approaches for integrating sensing, power, and communication systems. This concept can be extended as shown in FIGS. 6 and 7. This is through PFO packaging and patterned interconnects for high-density system integration of certain subsystems in tiles. This gives immense design space and options for optimal designs of communication systems. With photopatterned fan-out interconnects, the via densities can be scaled down based on laser and photo via resolution. Similarly, the combination of prepatterned wiring layers and cavity-embedding of ICs with printed bridge interconnects creates new low-cost manufacturing approaches. The printed interconnects can be also additively manufactured with adaptive patterning. This implies that the bridge links between the chip terminations and prepatterned traces can now be adapted based on the die shift and pattern shifts. Using artificial intelligence (AI) and digital twin advances, layouts can be continually adjusted for high yield and performance. Combination of panel fan-out packaging with additive manufacturing brings immense design and fabrication versatility to future manufacturing. One key advantage is the fan-out package with simultaneous front-side and backside metallization.

Embodiments of the subject invention provide a heterogeneous multifunctional package architecture comprising: a double-side multilayered substrate that supports interconnect wiring and/or passive components; subsystem tiles with active chipsets and passive elements inside the double-side multilayered substrate; and a planar interconnect scheme between the tile chipset and the double-side multilayered substrate chipset. The subsystem tiles can support at least one beamforming chip and/or at least one frequency conversion chip. The double-side multilayered substrate can be integrated with an antenna-in-package (AiP). The double-side multilayered substrate can be integrated with a beamforming communication module. The subsystem tile can hold a power management integrated circuit (IC), capacitors, and/or inductors. The double-side multilayered substrate can be extended vertically with another substrate using at least one metal interconnect array. The double-side multilayered substrate can be extended vertically with a digital chip to form a computing module. The heterogeneous multifunctional package architecture can further comprise a vertical interconnect to another substrate that acts as an interposer circuit board. The vertical interconnect can be to, for example, a digital chip interposer and/or a power module interposer.

Embodiments of the subject invention can provide: a rigid inorganic tile with cavities that hold analog, mixed signals and digital chips; and a polymer frame around the tile that holds certain vertical interconnects and components that are interconnected to an AiP to form a multibeam forming communication module. In an embodiment, a rigid inorganic tile can have cavities that hold power management IC, capacitors, and/or inductors, and a polymer frame can be disposed around the tile that holds certain vertical interconnects and components that are interconnected to digital chip to form a computing module. In an embodiment, a rigid inorganic tile can have cavities that house a stack of thin ceramic films and metal (e.g., nickel) films stacks to alternately form extended electrodes on each edge. The films can be inserted in cavities in the inorganic tile. The tile and/or the films can be metallized with metal inks. The films can be fan-out interconnected to other system components through the tile.

In an embodiment, a manufacturing process flow can include subsystem tiles with cavities, an embedded chipset and passive components inside the cavities, molded with a polymer, and double-side interconnect redistribution layers to interconnect and stitch active chipset and passives. The subsystem tiles can then be embedded inside a double-side multilayered substrate with planar fan-out interconnects. The polymer layer can comprise, for example, polyimide, epoxy, and/or polybenzoxazole. The polymer composite can comprise, for example, silica, alumina, and/or other fillers. The tiles can comprise, for example, glass, ceramic ribbon, and/or epoxy laminate with glass fiber cloth.

The methods and processes described herein can be embodied as code and/or data. The software code and data described herein can be stored on one or more machine-readable media (e.g., computer-readable media), which may include any device or medium that can store code and/or data for use by a computer system. When a computer system and/or processor reads and executes the code and/or data stored on a computer-readable medium, the computer system and/or processor performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that are capable of storing computer-readable information/data. Computer-readable media should not be construed or interpreted to include any propagating signals. A computer-readable medium of embodiments of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

When the term module is used herein, it can refer to software and/or one or more algorithms to perform the function of the module; alternatively, the term module can refer to a physical device (including but not limited to a device configured to perform the function of the module (e.g., by having software and/or one or more algorithms stored thereon)). When ranges are used herein, combinations and subcombinations of ranges (e.g., any subrange within the disclosed range) and specific embodiments therein are intended to be explicitly included. When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to embodiments of the invention.

Example 1

Cavities were formed inside a substrate of 1.0 millimeter (mm) thickness. Commercial FR4 laminates were used for this. Clearances of 100 micrometers (m) were designed between the substrate wall and chip. Typically, 40% power, 2% speed are used when the maximum power is 30 Watts (W) and speed is 10 millimeters per second (mm/s). The photopatterning was performed in two steps. In the first step, the dielectric resin was screen-printed into the cavity to accommodate for any height differences between the component and the cavity thickness. The chip was assembled into the cavity. This was followed by planarization of dielectric over the top to form the interconnect layers. If a photodefinable polymer resin dielectric was used, photoexposure was performed with an ultraviolet (UV) lamp with light at a wavelength of 360 nanometers (nm). The recommended dose is 200-300 millijoules per square centimeter ($mJ/cm^2$). As the laser lamp power is approximately 10 Watts per square centimeter ($W/cm^2$), about 20-30 seconds of exposure is recommended. The photodielectric was developed with an aqueous developer comprising of 1% by wt. of sodium carbonate or other appropriate developer. Components were assembled into the substrate cavities with a pick-and-place machine.

Example 2—Semi-Additive Patterning for Simultaneous Top-Side Redistribution Layer and Backside Metallization Wiring was then performed with semi-additive patterning or printed silver interconnects. Interconnect losses are a key metric for package design. Plating was performed at 10-30 milliamps per square centimeter ($mA/cm^2$) to achieve optimal surface finish, uniformity, and high plating rates of 0.5-1 micrometers per minute (m/min). With the current process optimization using two classes of dry-film photoresists and mylar masks, features up to 50 m were achieved, and this can be scaled up further to less than 10 μm later with glass masks. Vias and double-side sputtering are critical to enable double-side plating. Ti/Cu was sputtered at 50 nanometers (nm)/400 nm to form the speed layer. Semi-additive patterned copper with precise geometries can achieve 0.1 decibels per millimeter (dB/mm) over mm-Wave frequencies. Losses can also be suppressed below 0.04 dB/microvia for 40 μm via.

Example 3—Pre-Patterned Wiring, Cavity Embedding, and Printed Off-Chip Bridge Connections Low-loss laminates were used as substrates because of their excellent properties at high frequencies, good dimensional stability, and low moisture absorption rate. The fabrication process as illustrated in FIG. 3 was followed. Subtractive copper patterning with dry-film photoresist sensors was performed to acquire the desired line definition and high conductivity for sensor traces in contrast to printed silver traces. Dry-film photoresist was utilized to eventually support large-area fabrication at low cost. The process started with substrate cleaning and micro etching to enhance adhesion during photoresist patterning and copper etching. UV light was used for lithography (at 360 nm narrowband wavelength) with an energy dose of 100-120 mJ/cm². The photoresist pattern for the copper trace circuit was then developed in a 1% sodium bicarbonate solution at 60° C. for 65 seconds, followed by rinsing in deionized (DI) water. In order to improve the etching rate, the etchant was heated to 60° C. At the end, photoresist was removed with acetone to expose the copper traces. The substrate was subsequently laser-drilled with vias to interface with the metal pads on the backside.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section, if present) are incorporated by reference in their entirety, including all figures and tables, to the extent they are not inconsistent with the explicit teachings of this specification.

What is claimed is:

1. A heterogeneous multifunctional package architecture, comprising:
   a first substrate configured to support interconnect wiring and passive electronic components, the first substrate being multilayered, the first substrate being an organic laminate substrate, and the first substrate comprising a substrate chipset;
   a plurality of rigid inorganic subsystem tiles comprising cavities and vias, the plurality of rigid inorganic subsystem tiles being disposed within a layer of the first substrate, and the vias comprising an active tile chipset;
   a gap-fill material between chip walls of the active tile chipset and the plurality of rigid inorganic subsystem tiles, and between the first substrate and the plurality of rigid inorganic subsystem tiles; and
   a planar interconnect scheme between the active tile chipset and the substrate chipset,
   the first substrate being double-sided such that an upper surface of the first substrate and a lower surface of the first substrate are both configured to electrically connect to electrical components,
   the upper surface of the first substrate being opposite from the lower surface of the first substrate.

2. The heterogeneous multifunctional package architecture according to claim 1, the plurality of subsystem rigid inorganic tiles supporting at least one beamforming chip.

3. The heterogeneous multifunctional package architecture according to claim 1, the plurality of subsystem rigid inorganic tiles supporting at least one frequency conversion chip.

4. The heterogeneous multifunctional package architecture according to claim 1, the first substrate comprising a beamforming communication device integrated therewith.

5. The heterogeneous multifunctional package architecture according to claim 1, the plurality of subsystem rigid inorganic tiles supporting at least one inductor, at least one capacitor, and at least one power management integrated circuit (IC).

6. The heterogeneous multifunctional package architecture according to claim 1, further comprising a second substrate electrically connected to the first substrate by at least one metal interconnect array, and
   the gap-fill material comprising a polymer.

7. The heterogeneous multifunctional package architecture according to claim 1, further comprising a digital chip electrically connected to the first substrate, such that the heterogeneous multifunctional package architecture forms a computing device.

8. The heterogeneous multifunctional package architecture according to claim 1, further comprising a vertical interconnect configured to connect to a second substrate configured to be an interposer circuit board.

9. The heterogeneous multifunctional package architecture according to claim 8, further comprising the second substrate, and the second substrate being a digital chip interposer.

10. The heterogeneous multifunctional package architecture according to claim 8, further comprising the second substrate, and the second substrate being a power device interposer.

11. A subsystem tile for electronics, the subsystem tile comprising:
   a rigid tile portion comprising at least one cavity configured to receive an electronic component with interconnect wiring;
   a polymer-based laminate frame disposed around the rigid tile portion within a same system block layer, the polymer-based laminate frame holding wiring interconnects and vias;
   a gap-fill material filling in the at least one cavity of the rigid tile portion and disposed around the rigid tile portion; and
   at least one vertical interconnect disposed within the polymer-based laminate frame.

12. The subsystem tile according to claim 11, the rigid tile portion being formed of an inorganic material, and
   the gap-fill material comprising a polymer.

13. The subsystem tile according to claim 11, the at least one cavity being configured to receive at least one of an analog chip, a mixed signal chip, and a digital chip.

14. A beamforming communication device, comprising:
   an antenna-in-package interconnected with the subsystem tile according to claim 13,
   the subsystem tile comprising an analog chip disposed in a first cavity of the at least one cavity, a mixed signal chip disposed in a second cavity of the at least one cavity, and a digital chip disposed in a third cavity of the at least one cavity.

15. The subsystem tile according to claim 11, the at least one cavity being configured to receive at least one of an inductor, a capacitor, and a power management integrated circuit.

16. A computing device, comprising:

a digital chip interconnected with the subsystem tile according to claim 11, the subsystem tile comprising an inductor disposed in a first cavity of the at least one cavity, a capacitor disposed in a second cavity of the at least one cavity, and a power management integrated circuit disposed in a third cavity of the at least one cavity.

17. The subsystem tile according to claim 11, comprising a stack of thin ceramic films and metal films disposed in the at least one cavity, the metal films forming extended electrodes on edges of the stack, and the stack being metallized with at least one metal ink.

18. The subsystem tile according to claim 17, the stack being fan-out interconnected to a plurality of electrical components.

19. The subsystem tile according to claim 17, the metal films being nickel films.

20. A heterogeneous multifunctional package architecture, comprising:

a first substrate configured to support interconnect wiring and passive electronic components, the first substrate being multilayered, the first substrate being an organic laminate substrate, and the first substrate comprising a substrate chipset;

a plurality of rigid inorganic subsystem tiles comprising cavities and vias, the plurality of rigid inorganic subsystem tiles being disposed within a layer of the first substrate, and the vias comprising an active tile chipset;

a gap-fill material between chip walls of the active tile chipset and the plurality of rigid inorganic subsystem tiles, and between the first substrate and the plurality of rigid inorganic subsystem tiles; and a planar interconnect scheme between the active tile chipset and the substrate chipset, the first substrate being double-sided such that an upper surface of the first substrate and a lower surface of the first substrate are both configured to electrically connect to electrical components, the upper surface of the first substrate being opposite from the lower surface of the first substrate, the plurality of rigid inorganic subsystem tiles supporting at least one of the following: a beamforming chip; a frequency conversion chip; an inductor; a capacitor; and a power management integrated circuit, the heterogeneous multifunctional package architecture further comprising a second substrate electrically connected to the first substrate by at least one metal interconnect array, the second substrate being a digital chip interposer or a power device interposer, and the gap-fill material comprising a polymer.

* * * * *